United States Patent
Kikuchi

(10) Patent No.: US 9,620,409 B2
(45) Date of Patent: Apr. 11, 2017

(54) SEMICONDUCTOR DEVICE AND METHOD OF MANUFACTURING THE SAME

(71) Applicant: Sumitomo Electric Device Innovations, Inc., Yokohama-shi (JP)

(72) Inventor: Ken Kikuchi, Yokohama (JP)

(73) Assignee: Sumitomo Electric Device Innovations, Inc., Yokohama-shi (JP)

(*) Notice: Subject to any disclaimer, the term of this patent is extended or adjusted under 35 U.S.C. 154(b) by 0 days.

(21) Appl. No.: 14/673,039

(22) Filed: Mar. 30, 2015

(65) Prior Publication Data

US 2015/0279722 A1 Oct. 1, 2015

(30) Foreign Application Priority Data

Mar. 31, 2014 (JP) .................. 2014-072821

(51) Int. Cl.
*H01L 29/423* (2006.01)
*H01L 29/778* (2006.01)
*H01L 21/765* (2006.01)
*H01L 29/40* (2006.01)
*H01L 29/08* (2006.01)
*H01L 29/20* (2006.01)

(52) U.S. Cl.
CPC .......... *H01L 21/765* (2013.01); *H01L 29/401* (2013.01); *H01L 29/402* (2013.01); *H01L 29/7787* (2013.01); *H01L 29/0843* (2013.01); *H01L 29/2003* (2013.01); *H01L 29/404* (2013.01); *H01L 29/42316* (2013.01); *H01L 29/778* (2013.01)

(58) Field of Classification Search
CPC ... H01L 29/402; H01L 29/404; H01L 29/401; H01L 29/778
See application file for complete search history.

(56) References Cited

U.S. PATENT DOCUMENTS

2008/0108189 A1* 5/2008 Tabatabaie ............ H01L 29/402
438/197
2009/0108299 A1* 4/2009 Smorchkova ......... H01L 29/404
257/194

FOREIGN PATENT DOCUMENTS

JP 2012-253181 12/2012

OTHER PUBLICATIONS

Microposit S1800 Series Photo Resists Feature, Shipley, pp. 1-5, http://www.microchem.com/PDFs_Dow/S1800.pdf, downloaded May 16, 2016.*

* cited by examiner

*Primary Examiner* — Yu Chen
(74) *Attorney, Agent, or Firm* — Venable LLP; Michael A. Sartori; F. Brock Riggs

(57) ABSTRACT

A method of manufacturing a semiconductor device includes processes of forming a gate electrode, a source electrode, and a drain electrode on a nitride semiconductor layer, forming an insulating film including, on a surface thereof, a step that covers the gate electrode and reflects a shape of the gate electrode, and a flat portion, forming a mask on the insulating film, forming an opening in the mask, the opening including a shape in which a side surface of the step is located on an inner side of the opening and an upper surface end portion of the gate electrode is located on an outer side of the opening, and having an overhang shape extending in a depth direction, and forming a field plate extending from a side surface of the step to the flat portion using the mask.

9 Claims, 12 Drawing Sheets

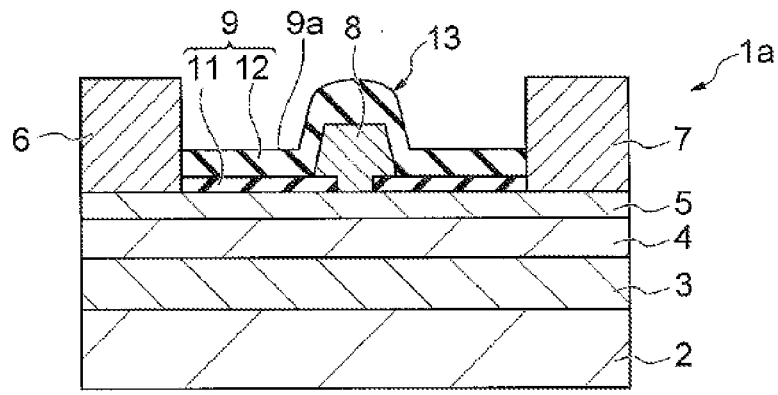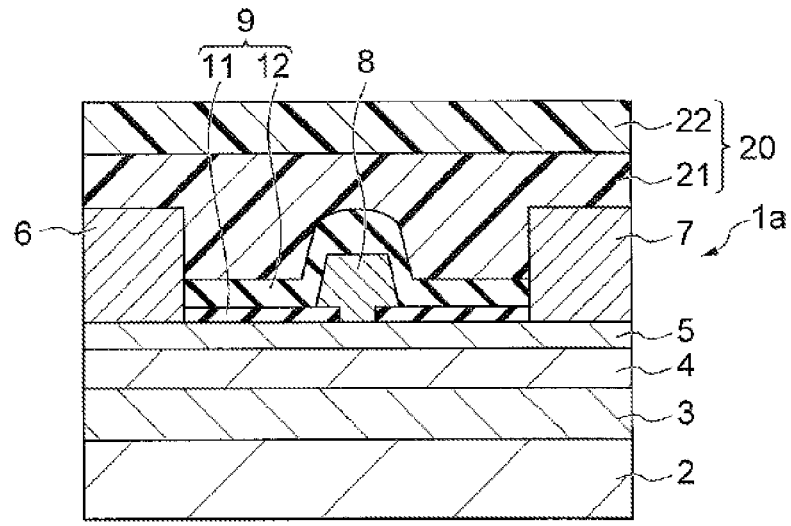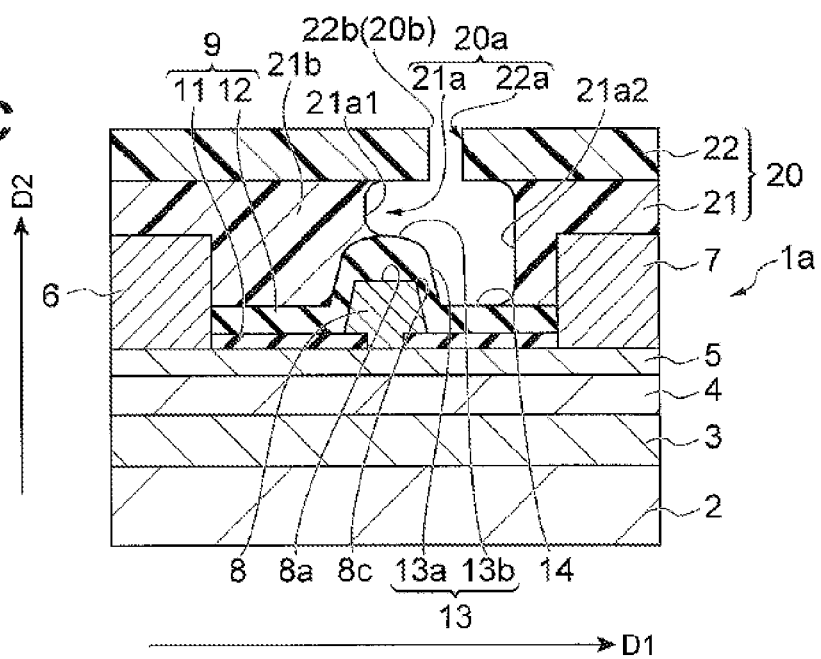

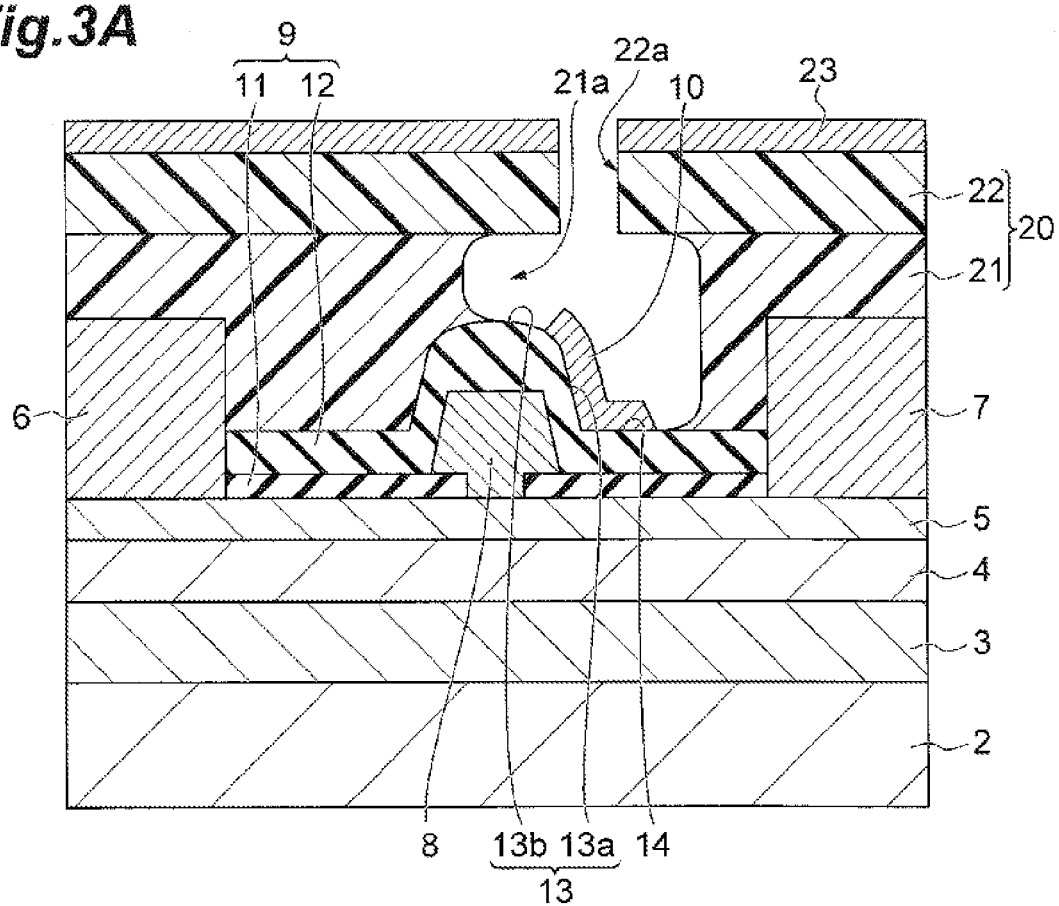
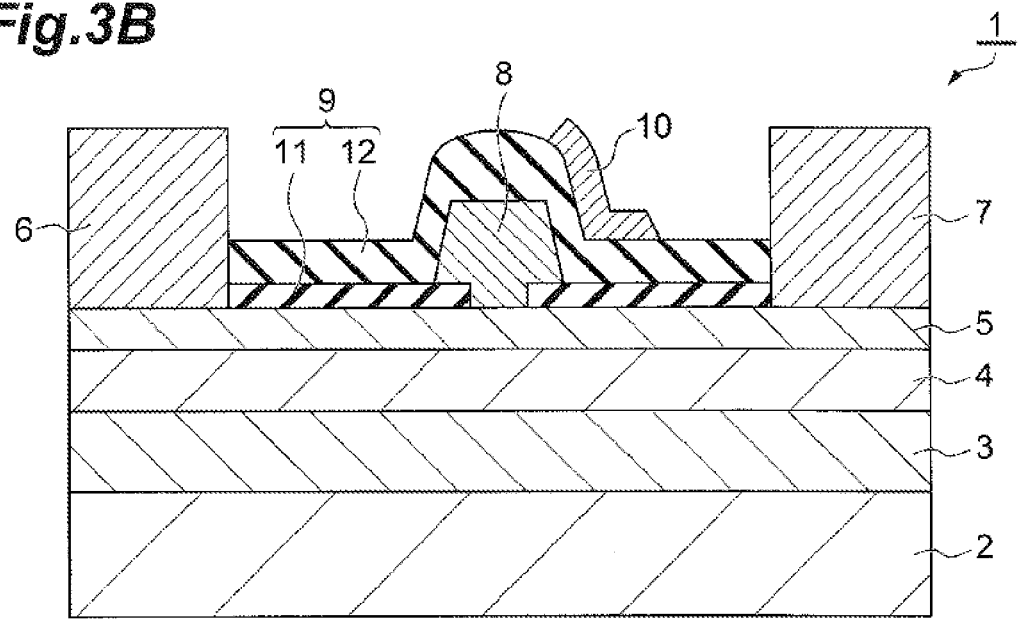

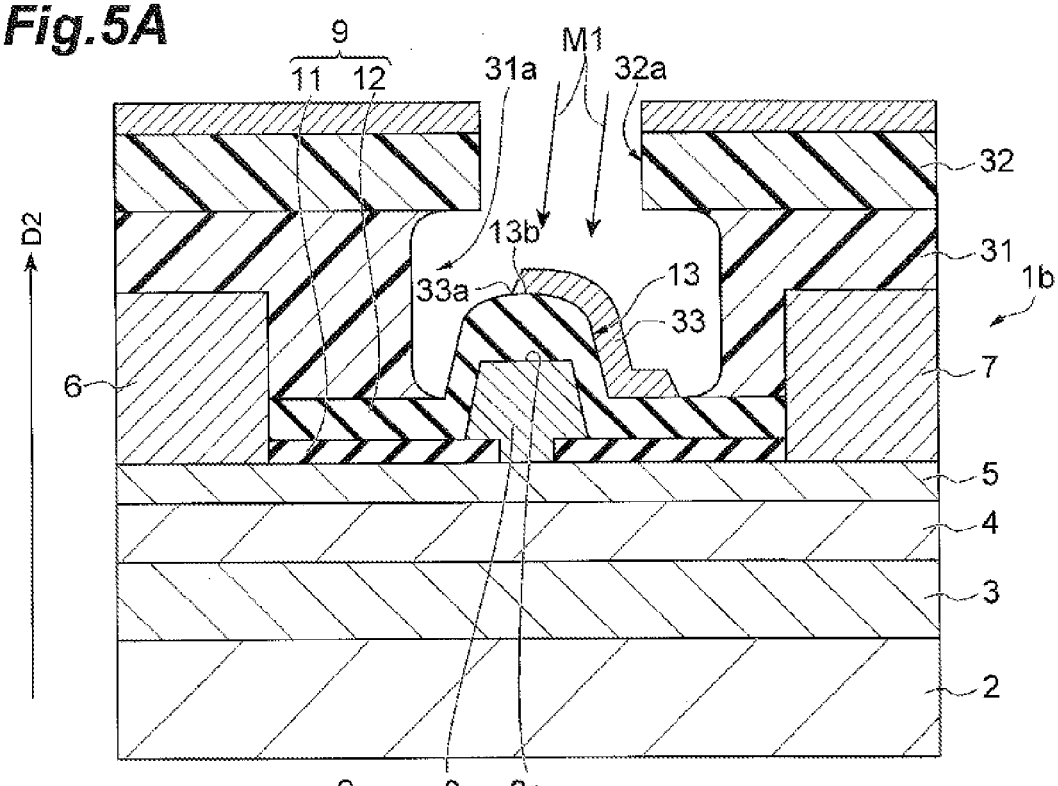
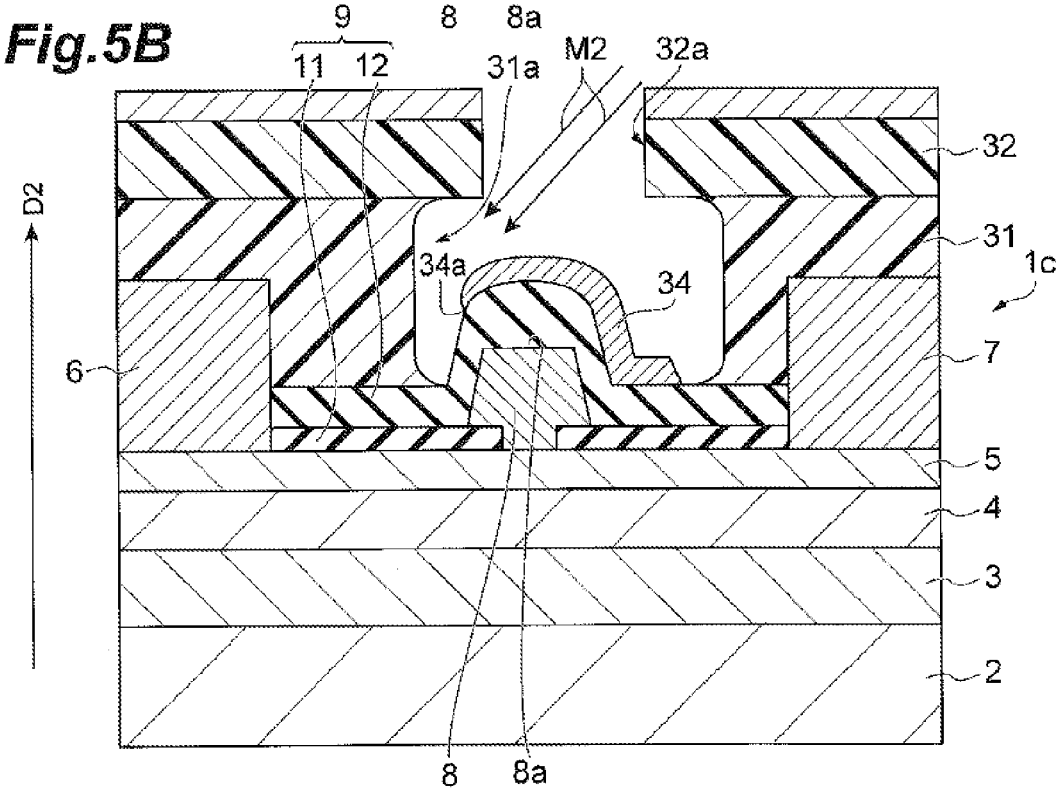

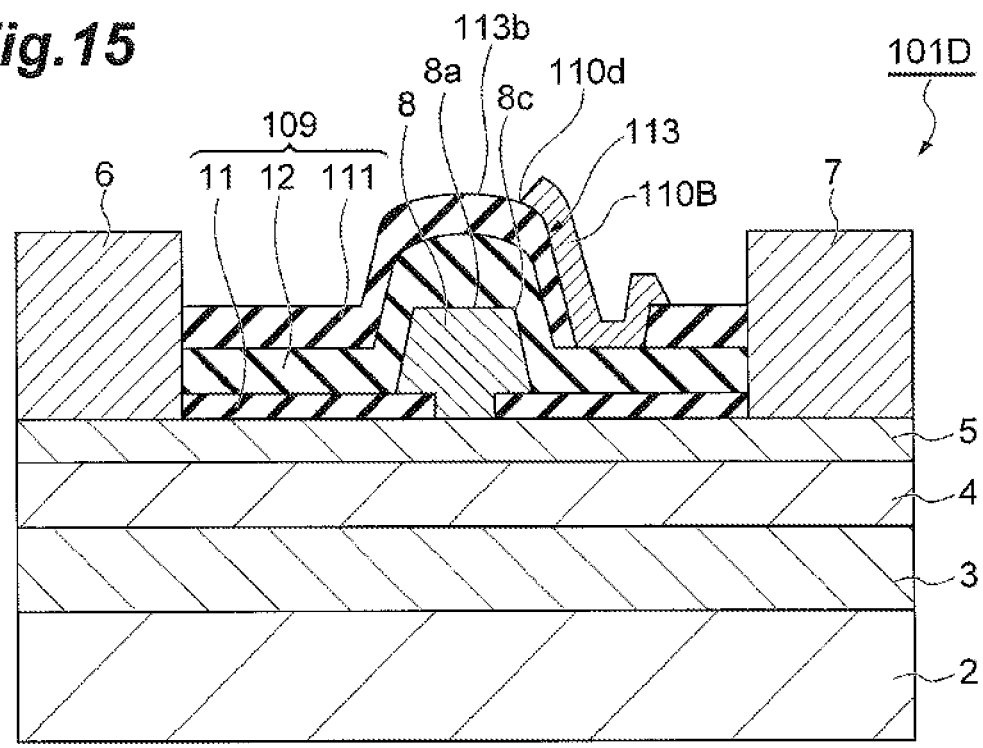
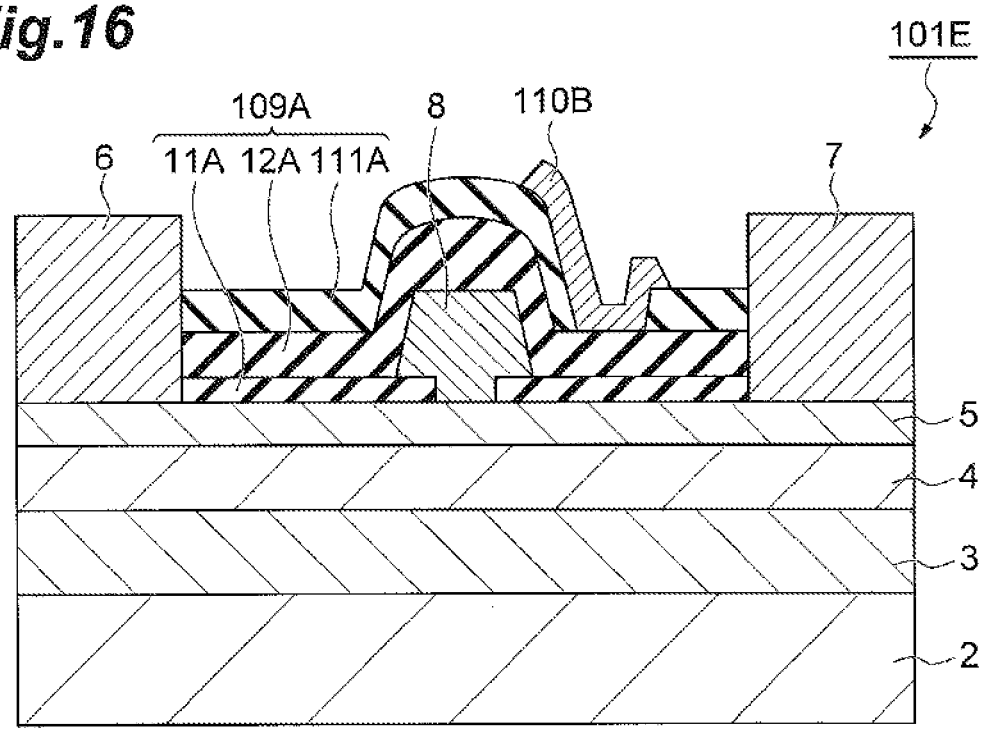

SEMICONDUCTOR DEVICE AND METHOD OF MANUFACTURING THE SAME

BACKGROUND OF THE INVENTION

Field of the Invention

The present invention relates to a semiconductor device and a method of manufacturing the semiconductor device.

Related Background Art

A technology for providing a field plate in a transistor (a high electron mobility transistor, referred also to as an HEMT) including a nitride semiconductor used for an amplifier for wireless communication or the like so as to alleviate an electric field applied to a gate end or the like is known. By providing the field plate, for example, a decrease in a drain current (current collapse) when a high voltage is applied to the HEMT is suppressed. Further, the field plate has effects of shielding coupling between a drain electrode and a gate electrode. For example, in Japanese Patent Laid-Open Publication No. 2012-253181, a field plate is provided on an insulating film having, on a surface, a step covering a gate electrode and reflecting a shape of the gate electrode.

SUMMARY OF THE INVENTION

By the field plate being provided as in Japanese Patent Laid-Open Publication No. 2012-253181 as described above, capacitance is generated between the field plate and the gate electrode via the insulating film and between the field plate and the drain electrode via the insulating film. Since electrical characteristics of the HEMT may deteriorate due to this capacitance, it is necessary to reduce the capacitance (particularly, the capacitance generated between the field plate and the gate electrode).

An object of the present invention is to provide a semiconductor device capable of reducing the capacitance generated between the field plate and the gate electrode, and a method of manufacturing the semiconductor device.

A method of manufacturing a semiconductor device according to an aspect of the present invention includes processes of: forming a gate electrode, a source electrode, and a drain electrode on a semiconductor layer; forming an insulating film, the insulating film including, on a surface thereof, a step that covers the gate electrode and reflects a shape of the gate electrode, and a flat portion located between the step and the drain electrode; forming a resist on the insulating film; forming a window in the resist, the window including a shape in which a side surface of the step is located on an inner side of the window and an upper surface end portion of the gate electrode is located on an outer side of the window, and having an overhang shape in which a distance from the upper surface thereof to the step of the insulating film is shorter than a distance from the upper surface thereof to the flat portion and that extends in a depth direction thereof; and depositing a metal material on the insulating film using the resist as a mask to form a field plate extending from a side surface of the step to the flat portion.

According to the present invention, it is possible to provide the semiconductor device capable of reducing the capacitance generated between the field plate and the gate electrode, and the method of manufacturing the semiconductor device.

BRIEF DESCRIPTION OF THE DRAWINGS

FIGS. 2A to 2C are diagrams illustrating a method of manufacturing a semiconductor device according to the first embodiment.

FIGS. 3A to 3B are diagrams illustrating a method of manufacturing a semiconductor device according to the first embodiment.

FIGS. 5A to 5B are diagrams illustrating a method of manufacturing a semiconductor device according to a comparative example.

FIG. 15 illustrates a cross-sectional view of a semiconductor device according to a fourteenth modification example of the second embodiment.

FIG. 16 illustrates a cross-sectional view of a semiconductor device according to a fifteenth modification example of the second embodiment.

DESCRIPTION OF THE PREFERRED EMBODIMENTS

Figure 1:
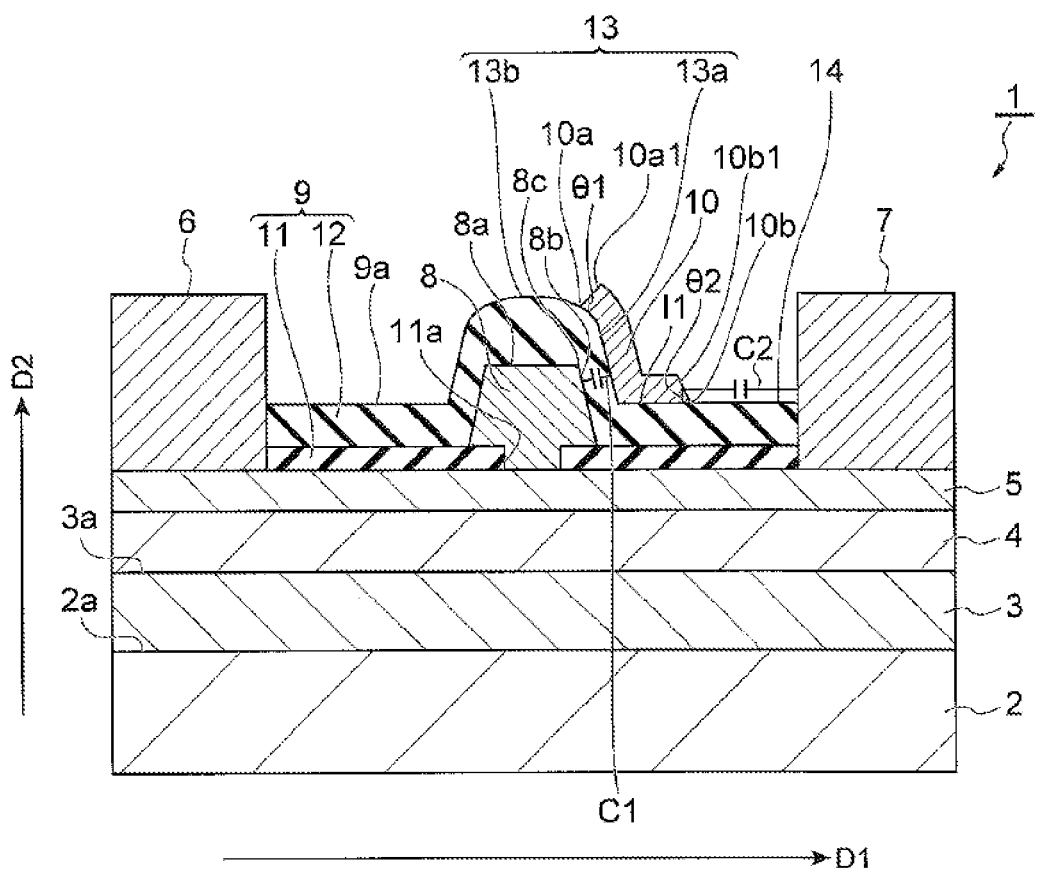
FIG. 1 is a cross-sectional view illustrating a semiconductor device according to a first embodiment.

[Description of Embodiments of the Present Invention]

First, content of embodiments of the present invention will be listed and described. One embodiment of the present invention is a method of manufacturing a semiconductor device, the method comprising: forming a gate electrode, a source electrode, and a drain electrode on a semiconductor layer, the gate electrode having an edge in a side of the drain electrode and another edge in a side of the source electrode; forming an insulating film that includes a step and a flat portion on a surface thereof, the step covering the gate electrode and tracing a shape of the gate electrode, the flat portion locating between the step and the drain electrode; forming a photoresist on the insulating film; forming a mask on the insulating film, the mask having an window and an opening to form an overhang, the window having an inner side and an outer side, the inner side being aligned with the edge of the gate electrode in the side of the drain electrode, the outer side being positioned on the flat portion of the insulating film; and depositing a metal on the insulating film using the photoresist as a mask to form a field plate extending from a side surface of the step to the flat portion.

In this manufacturing method, by forming the field plate using the above-described mask, one end on the source electrode side of the field plate along a direction from the source electrode to the drain electrode may be located on the drain electrode side relative to the edge on the drain electrode side of the upper surface of the gate electrode. Effects of the field plate (effects of shielding coupling between the drain electrode and the gate electrode) are provided in the portion of the field plate covering the upper surface of the gate electrode, but are less and, rather, lead to an increase in capacitance generated between the field plate and the gate electrode. According to the manufacturing method described above, since the field plate can be formed not to cover the upper surface of the gate electrode, it is possible to reduce the capacitance generated between the field plate and the gate electrode. Further, it is possible to shield the coupling between the drain electrode and the gate electrode using the field plate.

Further, the field plate may have a thickness in an end portion thereof in a side of the source electrode greater than a thickness of another end portion thereof in a side of the drain electrode. In this case, a thickness of an end portion on the drain electrode side of the field plate along a direction from the source electrode to the drain electrode is reduced toward the drain electrode. Accordingly, it is possible to reduce capacitance generated between the end portion on the drain electrode side and the drain electrode.

Further, the step of forming the mask may include steps of forming a first photoresist on the insulating film; forming a second photoresist on the first photoresist sequentially, the second photoresist containing no photo-sensitive materials; and irradiating the first photoresist and the second photoresist with ultraviolet light. In this case, it is possible to accurately form the window having an overhang shape in the resist.

Another embodiment of the present invention is a method of manufacturing a semiconductor device, the method comprising steps of: forming a gate electrode, a source electrode, and a drain electrode on a semiconductor layer; covering the gate electrode with a second insulating film on the first insulating film such that the second insulating film has a step with a shape tracing a shape of the gate electrode and a flat portion locating between the gate electrode and the drain electrode; forming a third insulating film on the second insulating film, the third insulating film having a step with a shape tracing the step of the second insulating film and a flat portion between the step of the third insulating film and the drain electrode, an opening being formed in the flat portion of the third insulating film; and forming a field plate on the third insulating film, the field plate including a portion covering the opening.

In this manufacturing method, the film thickness of the region on the flat portion of the second insulating film, located between the step in the first insulating film and the drain electrode is reduced. Accordingly, a distance between the field plate and the semiconductor layer can be shortened to reduce current collapse, Further, in this manufacturing method, the insulating film other than the portion in which the field plate functions can be formed to a greater film thickness. Effects obtained by providing the field plate (effects of shielding coupling between the drain electrode and the gate electrode) are obtained in the portion of the field plate covering the upper surface of the gate electrode, but are less and, rather, lead to an increase in the capacitance generated between the field plate and the gate electrode. According to the above-described manufacturing method, it is possible to increase a distance between the field plate and the upper surface of the gate electrode and to reduce the capacitance generated between the field plate and the gate electrode. Further, it is possible to shield the coupling between the drain electrode and the gate electrode using the field plate.

Another embodiment of the present invention is a semiconductor device including a semiconductor layer; a source electrode provided on the semiconductor layer; a drain electrode provided on the semiconductor layer; a gate electrode provided on the semiconductor layer and located between the source electrode and the drain electrode; an insulating film having a step and a flat portion, the step covering the gate electrode and tracing a shape of the gate electrode, the flat portion extending from the step to the drain electrode; and a field plate provided on the insulating film and extending from a side surface of the step facing the drain electrode to the flat portion, wherein the field plate has a thickness at an end portion in a side of the source electrode greater than a thickness of another end portion in a side of the drain electrode side thereof.

In this semiconductor device, a thickness of one end on the drain electrode side of the field plate along a direction from the source electrode to the drain electrode is reduced toward the drain electrode. Accordingly, it is possible to reduce capacitance generated between the one end on the drain electrode side and the drain electrode.

Another embodiment of the present invention is a method of manufacturing a semiconductor device, the method including processes of forming a gate electrode, a source electrode, and a drain electrode on a nitride semiconductor layer; forming an insulating film including, on a surface, a step that covers the gate electrode and reflects a shape of the gate electrode; forming a mask having an opening on the insulating film between the gate electrode and the drain electrode; forming a field plate on the insulating film using a mask, the field plate extending from a side surface of the step between the gate electrode and the drain electrode to the drain electrode, wherein one end on the source electrode side of the field plate along a direction from the source electrode to the drain electrode is located on the drain electrode side relative to an edge on the drain electrode side of a top surface of the gate electrode.

In this manufacturing method, the opening of the mask used to form the field plate is located on the insulating film between the gate electrode and the drain electrode. By forming the field plate using this mask, the one end on the source electrode side of the field plate along the direction from the source electrode to the drain electrode can be located on the drain electrode side relative to the edge on the drain electrode side in the top surface of the gate electrode. The portion of the field plate covering the top surface of the gate electrode makes a small contribution to effects of the field plate and, rather, leads to an increase in the capacitance generated between the field plate and the gate electrode. According to the manufacturing method described above, since the field plate can be formed not to cover the top surface of the gate electrode, it is possible to reduce the capacitance generated between the field plate and the gate electrode.

Further, an angle formed by an end surface of one end of the field plate and an interface between the field plate and the insulating film may be an acute angle. In this case, capacitance generated between the end surface of the one end of the field plate and the gate electrode is reduced. Therefore, it is possible to further reduce the capacitance generated between the field plate and the gate electrode.

Further, an angle formed by an end surface of the other end on the drain electrode side of the field plate and the interface between the field plate and the insulating film may be an acute angle. In this case, capacitance generated between the end surface of the other end of the field plate and the drain electrode is reduced.

Further, the one end of the field plate may not contact the upper surface of the step. In this case, it is possible to further reduce the capacitance generated between the field plate and the gate electrode.

Further, the process of forming the mask may include processes of: forming a first mask on the insulating film; forming a second mask provided on the first mask, the second mask having a lower photosensitivity than the first mask; and irradiating the first mask and the second mask with light through a photomask having an opening to remove a portion of the first mask and a portion of the second mask, and a residual portion in the first mask may overlap the gate electrode in a thickness direction of the nitride semiconductor layer. In this case, incidence of metal atoms forming the field plate on the gate electrode is suppressed by the residual portion of the first mask. Therefore, it is possible to accurately form the field plate so that one end on the source electrode side of the field plate can be located on the drain electrode side relative to the edge (end portion) on the drain electrode side of the upper surface of the gate electrode.

Another embodiment of the present invention is a semiconductor device, including: a nitride semiconductor layer; a source electrode provided on the nitride semiconductor layer; a drain electrode provided on the nitride semiconductor layer; a gate electrode provided on the nitride semiconductor layer and located between the source electrode and the drain electrode; an insulating film having, on a surface, a step that covers the gate electrode and reflects a shape of the gate electrode; and a field plate provided on the insulating film and extending from a side surface of the step between the gate electrode and the drain electrode to the drain electrode, wherein one end on the source electrode side of the field plate along a direction from the source electrode to the drain electrode is located on the drain electrode side relative to the edge on the drain electrode side of the upper surface of the gate electrode.

In this semiconductor device, the one end on the source electrode side of the field plate along a direction from the source electrode to the drain electrode is located on the drain electrode side relative to the edge on the drain electrode side of the upper surface of the gate electrode. The portion of the field plate covering the upper surface of the gate electrode makes a small contribution to effects of the field plate and, rather, leads to an increase in the capacitance generated between the field plate and the gate electrode. In this semiconductor device, since the field plate is provided not to cover the upper surface of the gate electrode, it is possible to reduce the capacitance generated between the field plate and the gate electrode.

Further, the one end of the field plate may not contact the upper surface of the step. In this case, it is possible to further reduce the capacitance generated between the field plate and the gate electrode.

Another embodiment of the present invention is a method of manufacturing a semiconductor device, the method including processes of forming a gate electrode, a source electrode, and a drain electrode on a nitride semiconductor layer; forming an insulating film including, on a surface, a step that covers the gate electrode and reflects a shape of the gate electrode; reducing a film thickness of at least a portion of the insulating film between a side surface of the step between the gate electrode and the drain electrode and the drain electrode; and forming a field plate on the insulating film, the field plate extending from the side surface of the step between the gate electrode and the drain electrode to the drain electrode.

In this manufacturing method, the film thickness of at least a portion in the insulating film between the side surface of the step of the insulating film between the gate electrode and the drain electrode, and the drain electrode is reduced. Accordingly, a distance between the field plate and the nitride semiconductor layer may be shortened to reduce current collapse. Further, in this manufacturing method, a film thickness of the insulating film other than the portion in which the field plate functions may be greater. The portion of the field plate covering the upper surface of the gate electrode makes a small contribution to effects of the field plate and, rather, leads to an increase in the capacitance generated between the field plate and the gate electrode. According to the above-described manufacturing method, it is possible to increase a distance between the field plate and the upper surface of the gate electrode and to reduce the capacitance generated between the field plate and the gate electrode.

Further, the insulating film includes a first insulating film, and a second insulating film provided on the first insulating film and formed of a different material from the first insulating film, the process of reducing the film thickness of the insulating film may include a process of exposing a portion of the first insulating film by removing a portion of the second insulating film between the side surface of the step between the gate electrode and the drain electrode and the drain electrode, and the field plate may be provided to extend on the exposed portion of the first insulating film. In this case, the first insulating film and the second insulating film are formed of different materials. Therefore, when the portion of the second insulating film is removed by etching, an etchant having a high selection ratio can be used to not etch the first insulating film. Therefore, it is possible to accurately remove only the portion of the second insulating film.

Further, the insulating film includes a first insulating film, a second insulating film provided on the first insulating film and formed of a different material from the first insulating film, and a third insulating film provided on the second insulating film and formed of a different material from the second insulating film, the process of reducing the film thickness of the insulating film may include a process of exposing a portion of the second insulating film by removing a portion of the third insulating film between the side surface of the step between the gate electrode and the drain electrode and the drain electrode, and the field plate may be provided to extend on the exposed portion of the second insulating film. In this case, the second insulating film and the third insulating film are formed of different materials. Therefore, when the portion of the third insulating film is removed by etching, an etchant having a high selection ratio can be used to not etch the second insulating film. Therefore, it is possible to accurately remove only the portion of the third insulating film.

Further, a process of forming a mask having an opening on the insulating film between the gate electrode and the drain electrode may be further included, the field plate may be formed using the mask, and one end on the source electrode side of the field plate along a direction from the source electrode to the drain electrode may be located on the drain electrode side relative to the edge on the drain electrode side of the upper surface of the gate electrode. In this case, the opening of the mask used to form the field plate is located on the insulating film between the gate electrode and the drain electrode. By forming the field plate using this mask, the one end on the source electrode side of the field plate along the direction from the source electrode to the drain electrode can be located on the drain electrode side relative to the edge on the drain electrode side of the upper surface of the gate electrode. Therefore, according to the manufacturing method described above, since the field plate can be formed not to cover the upper surface of the gate electrode, it is possible to further reduce the capacitance generated between the field plate and the gate electrode.

Further, the angle formed by an end surface of one end of the field plate and an interface between the field plate and the insulating film may be an acute angle. In this case, capacitance generated between the end surface of the one end of the field plate and the gate electrode is reduced. Therefore, it is possible to further reduce the capacitance generated between the field plate and the gate electrode.

Further, an angle formed by an end surface of the other end on the drain electrode side of the field plate and the interface between the field plate and the insulating film may be an acute angle. In this case, capacitance generated between the end surface of the other end of the field plate and the drain electrode is reduced.

Further, the one end of the field plate may not contact the upper surface of the step. In this case, it is possible to further reduce the capacitance generated between the field plate and the gate electrode.

Further, the process of forming the mask may include processes of: forming a first mask on the insulating film; forming a second mask provided on the first mask, the second mask having a lower photosensitivity than the first mask; and irradiating the first mask and the second mask with light through a photomask having an opening to remove a portion of the first mask and a portion of the second mask, and a residual portion in the first mask may overlap the gate electrode in a thickness direction of the nitride semiconductor layer, In this case, incidence of metal atoms forming the field plate on the gate electrode is suppressed by the residual portion of the first mask. Therefore, it is possible to accurately form the field plate so that one end on the source electrode side of the field plate can be located on the drain electrode side relative to the edge on the drain electrode side of the upper surface of the gate electrode.

Another embodiment of the present invention is a semiconductor device, including: a nitride semiconductor layer; a source electrode provided on the nitride semiconductor layer; a drain electrode provided on the nitride semiconductor layer; a gate electrode provided on the nitride semiconductor layer and located between the source electrode and the drain electrode; an insulating film having, on a surface, a step that covers the gate electrode and reflects a shape of the gate electrode; and a field plate provided on the insulating film and extending from a side surface of the step, which is a side surface between the gate electrode and the drain electrode, to the drain electrode, wherein a film thickness of at least a portion in the insulating film between the side surface between the gate electrode and the drain electrode, and the drain electrode is smaller than that of the other portion of the insulating film.

In this semiconductor device, the film thickness of at least a portion in the insulating film between the side surface of the step of the insulating film between the gate electrode and the drain electrode, and the drain electrode is smaller than that of the other portion of the insulating film. Accordingly, a distance between the field plate and the nitride semiconductor layer can be shortened to reduce current collapse. Further, in this semiconductor device, a film thickness of the insulating film other than the portion in which the field plate functions can be greater. The portion of the field plate covering the upper surface of the gate electrode makes a small contribution to effects of the field plate and, rather, leads to an increase in the capacitance generated between the field plate and the gate electrode. According to the above-described semiconductor device, it is possible to increase a distance between the field plate and the upper surface of the gate electrode and to reduce the capacitance generated between the field plate and the gate electrode.

Further, the insulating film includes a first insulating film, and a second insulating film provided on the first insulating film and formed of a different material from the first insulating film, at least a portion of the insulating film may be a region in which the second insulating film has been removed, and the field plate may be provided to extend on the region. In this case, the first insulating film and the second insulating film are formed of different materials. Accordingly, the portion of the second insulating film can be removed using an etchant with which the first insulating film is not easily etched. Therefore, a semiconductor device in which only the portion of the second insulating film has been accurately removed can be provided.

Further, the insulating film includes a first insulating film, a second insulating film provided on the first insulating film and formed of a different material from the first insulating film, and a third insulating film provided on the second insulating film and formed of a different material from the second insulating film, at least a portion of the insulating film may be a region in which the third insulating film has been removed, and the field plate may be provided to extend on the region. In this case, the second insulating film and the third insulating film are formed of different materials. Accordingly, the portion of the third insulating film can be removed using an etchant with which the second insulating film is not easily etched. Therefore, a semiconductor device in which only the portion of the third insulating film has been accurately removed can be provided.

Further, one end on the source electrode side of the field plate along a direction from the source electrode to the drain electrode can be located on the drain electrode side relative to the edge on the drain electrode side of the upper surface of the gate electrode. In this case, since the field plate is provided not to cover the upper surface of the gate electrode, it is possible to further reduce the capacitance generated between the field plate and the gate electrode.

Further, the one end of the field plate may not contact the upper surface of the step. In this case, it is possible to further reduce the capacitance generated between the field plate and the gate electrode.

Further, the other end on the drain electrode side of the field plate in a thickness direction of the nitride semiconductor layer may overlap with at least a portion of the insulating film. In this case, the other end of the field plate is located on the portion in which the insulating film becomes thinner. Accordingly, an area in which the other end of the field plate faces the drain electrode becomes smaller when viewed along a direction from the source electrode to the drain electrode. Therefore, it is possible to reduce the capacitance generated between the field plate and the drain electrode.

[Details of Embodiments of the Present Invention]

Hereinafter, preferred embodiments of the present invention will be described in detail with reference to the accompanying drawings. Further, in the following description, the same elements or elements having the same function are denoted with the same reference signs and repeated description will be omitted.

(First Embodiment)

FIG. 1 is a cross-sectional view illustrating a semiconductor device according to a first embodiment. A transistor 1 which is a semiconductor device includes a substrate 2, a nitride semiconductor layer (semiconductor layer) 3, an electron supply layer 4, a cap layer 5, a source electrode 6, a drain electrode 7, a gate electrode 8, an insulating film 9 and a field plate 10, as illustrated in FIG. 1. The transistor 1 is an HEW. A channel region is formed by a two-dimensional electron gas (2DEG) being generated at an interface between the nitride semiconductor layer 3 and the electron supply layer 4.

The substrate 2 is a substrate for crystal growth. An example of the substrate 2 includes a Si substrate, a SiC substrate, a sapphire substrate or a diamond substrate.

The nitride semiconductor layer 3 is a layer epitaxially grown from a surface 2a of the substrate 2. The vicinity of a surface 3a of the nitride semiconductor layer 3 functions as a channel region. The nitride semiconductor layer 3 is, for example, a GaN layer. A film thickness of the nitride semiconductor layer 3 is, for example, 300 to 1600 nm.

The electron supply layer 4 is a layer epitaxially grown on the nitride semiconductor layer 3. A film thickness of the electron supply layer 4 is, for example, 10 to 30 nm. The electron supply layer 4 is, for example, an AlGaN layer, an InAlN layer, or an InAlGaN layer. The electron supply layer 4 may be an n type.

The cap layer 5 is a layer epitaxially grown on the electron supply layer 4. A film thickness of the cap layer 5 is, for example, 3 to 10 nm. The cap layer 5 is a nitride semiconductor layer, and is, for example, a GaN layer. The cap layer 5 may be an n type.

The source electrode 6 and the drain electrode 7 are provided on the cap layer 5. The source electrode 6 and the drain electrode 7 are ohmic electrodes and have, for example, a stacked structure of a titanium (Ti) layer and an aluminum (Al) layer. In this case, the cap layer 5 and the Ti layer contact each other. The Al layer may be sandwiched by the Ti layer in a thickness direction (hereinafter referred to as a direction D2) of the nitride semiconductor layer 3.

The gate electrode 8 is provided on the cap layer 5 between the source electrode 6 and the drain electrode 7. The gate electrode 8 has, for example, a stacked structure of a nickel (Ni) layer, a platinum (Pt) layer, and a gold (Au) layer. The gate electrode 8 is covered with the insulating film 9.

The insulating film 9 includes a first insulating film 11 and a second insulating film 12, and protects the cap layer 5 or the like. An opening 11a is provided in the first insulating film 11. The gate electrode 8 is provided in the opening 11a. The second insulating film 12 is provided to cover an upper surface 8a and a side surface 8b of the gate electrode 8. Therefore, a step 13 reflecting a shape of the gate electrode 8, and a flat portion 14 located from the step 13 to the drain electrode 7 are provided in the surface 9a of the insulating film 9. The first insulating film 11 and second insulating film 12 are composed of, for example, a silicon nitride (SiN) film, a silicon oxide (SiOx) film, a silicon nitride oxide (SiON) film, or an aluminum oxide (AlOx) film. A film thickness of the first insulating film 11 is, for example, 20 to 300 nm. A film thickness of the second insulating film 12 is, for example, 50 to 800 nm.

The field plate 10 is, for example, a metal layer having a stacked structure of an Ni layer and an Au layer from the side of the substrate 2 or a stacked structure of a Ti layer and an Au layer from the side of the substrate 2. The field plate 10 is provided on the insulating film 9 between the drain electrode 7 and the gate electrode 8. Specifically, the field plate 10 extends from a side surface 13a of the step 13 of the insulating film 9 between the gate electrode 8 and the drain electrode 7 to the drain electrode 7. By the field plate 10 thus described, a coupling between the gate electrode 8 and the drain electrode 7 may be shielded and the electric field in the end portion of the gate electrode 8 may be moderated. A thickness of the field plate 10 is, for example, 0.1 to 1.0 μm. A capacitor C1 is induced between the field plate 10 and the side surface 8b of the gate electrode 8. Further, another capacitor C2 is induced between the field plate 10 and the drain electrode 7.

Along a direction (hereinafter referred to as a direction D1) from the source electrode 6 to the drain electrode 7, one end 10a of the field plate 10 in the side of the source electrode 6 is located on the gate electrode 8 but in the side of the drain electrode 7 relative to an edge 8c, or an upper surface end portion, of the gate electrode 7. An angle θ1 formed by an end surface 10a1 of the one end 10a of the field plate 10 and an interface I1 between the field plate 10 and the insulating film 9 is an acute angle. Further, along the direction D1, an end surface 10b1 of the other end 10b of the field plate 10 in the side of the drain electrode 7 is located on the flat portion 14 between the drain electrode 7 and the gate electrode 8. An angle θ2 formed by the end surface 10b1 of the other end 10b of the field plate 10 and the interface I1 is also an acute angle. For example, along the direction D1, a length of the field plate 10 located on the flat portion 14 is 0.3 to 1.7 μm. The one end 10a of the field plate 10 may be not in contact with an upper surface 13b of the step 13 of the insulating film 9.

The field plate 10 and the source electrode 6 are electrically connected to each other. That is, the field plate 10 has the same electric potential as the source electrode 6. Therefore, the capacitance between the source electrode 6 and the drain electrode 7 includes the capacitance between the field plate 10 and the drain electrode 7. Further, the capacitance between the source electrode 6 and the gate electrode 8 also includes the capacitance between the field plate 10 and the gate electrode 8.

Next, a method of manufacturing the semiconductor device according to a first embodiment will be described using FIGS. 2A to 4B. FIGS. 2A to 2C, FIGS. 3A and 3B, FIGS. 4A and 4B are diagrams illustrating the method of manufacturing the semiconductor device according to the first embodiment.

First, in a first step, a transistor 1a including a substrate 2, a nitride semiconductor layer 3, an electron supply layer 4, a cap layer 5, a source electrode 6, a drain electrode 7, a gate electrode 8, and an insulating film 9 is formed, as illustrated in FIG. 2A. The nitride semiconductor layer 3, the electron supply layer 4 and the cap layer 5 are sequentially formed on the substrate 2 using, for example, an organometallic vapor phase epitaxy method (hereinafter referred to as OMVPE method). The source electrode 6, the drain electrode 7, and the gate electrode 8 are formed on the cap layer 5 (on the nitride semiconductor layer) using, for example, a vacuum deposition method. The source electrode 6 and the drain electrode 7 have, for example, a stacked structure including a Ni layer, a Pt layer, and an Au layer from the side of the substrate 2. The gate electrode 8 has, for example, a stacked structure including a Ti layer and an Al layer from the side of the substrate 2. For example, using a chemical vapor deposition (hereinafter referred to as a CVD), a first insulating film 11 and a second insulating film 12 constituting the insulating film 9 are formed so as to cover the gate electrode 8. The first insulating film 11 and the second insulating film 12 are, for example, SiN films. A step 13 reflecting a shape of the gate electrode 8 and a flat portion 14 (which indicates a region between the step 13 and the drain electrode 7) are provided on a surface 9a of the insulating film 9.

Then, in a second step, a first photoresist 21 and a second photoresist 22 are sequentially formed as a mask 20 on the transistor 1a, as illustrated in FIG. 2B. The first photoresist 21 and the second photoresist 22 are made of positive type photoresist, and are formed by, for example, spin-coating. A thickness of the first photoresist 21 is, for example, 1200 μm, and a thickness of the second photoresist 22 is, for example, 600 μm. The thickness of the first photoresist 21 may be greater than at least a sum of the thickness of the gate electrode 8 and a thickness of the field plate 10.

Then, in a third step, an opening 20a is formed in the mask 20, for example, using photolithography, as illustrated in FIG. 2C. Specifically, a laterally extending opening 21a is formed in the first photoresist 21, and a window 22a is formed in the second mask 22. The window 22a of the second photoresist 22 overlaps with the side surface 13a of the step 13 of the insulating film 9 between the drain electrode 7 and the gate electrode 8. The window 22a does not overlap, or excludes, an upper surface 13b of the step 13 of the insulating film 9, when viewed along the direction D2. When viewed along the direction D2, a side surface 13a of the step 13 locates within the window 22a, and an edge (upper surface end portion) 8c of the upper surface 8a of the gate electrode 8 is located in the outer side of the window 22a. The first photoresist 21 and the second photoresist 22 are irradiated with ultraviolet rays, for example, through a photomask having an opening by an ordinary exposure technique for a photoresist.

Features of the first and second photoresists, 21 and 22, are that the first photoresist 21 contains photo-sensitivity materials but the second photoresist 22 contains no photo-sensitivity material. Because the first photoresist 21 contains photo-sensitivity materials, portions thereof irradiated with ultraviolet rays enhance the alkali solubility thereof compared with portions not irradiated with ultraviolet rays. Moreover, because the first photoresist 21 originally contains photosensitivity materials, the alkali solubility thereof is less than that of the second photoresist 22. Thus, comparing the solubility against the developer, namely, the alkali solubility, the portions of the first photoresist 21 irradiated with the ultraviolet rays shows the highest, the other portions not irradiated with the ultraviolet rays is smallest, and the second photoresist 22 containing no photosensitivity material shows a midpoint between them.

It is preferable for the irradiated region to be formed so that, along the direction D1, an edge 21a1 of the first mask 21 in the side of the source electrode 6 is located on the upper surface 13b of the step 13. Another edge 21a2 of the second mask 21 in the side of the drain electrode 7 locates on the flat portion 14. A distance from an upper surface 20b of the second mask 22 to the step 13 of the insulating film 9 is smaller than a distance from the upper surface 20b of the second mask 22 to the flat portion 14 of the insulating film 9. Further, photosensitivity of the first mask 21 is higher than that of the second mask 22, as described above. Therefore, along the direction D2, the opening 21a of the first mask 21 becomes greater than the window 22a of the second mask 22. Further, along the direction D2, a residual portion 21b of the first mask 21 overlaps with the upper surface 8a of the gate electrode 8. The residual portion 21b may overlap with the edge 8c of the upper surface 8a of the gate electrode 8. Further, a width of the window 22a along the direction D1 is, for example, 0.1 to 1.5 μm. Thus, the opening 20a (the opening 21a and the window 22a) of the mask 20 is formed from the first mask 21 and the second mask 22 having different exposure sensitivities, and forms an overhang. Further, the opening 20a also includes a region having a different depth therein, and arranged and formed on the step 13 and the flat portion 14 of the insulating film 9 between the gate electrode 8 and the drain electrode 7, as illustrated in FIG. 2C.

Then, in a fourth step, a metal material is deposited on the insulating film 9 using the mask 20 thus described to form the field plate 10 extending from the side surface 13a of the step 13 to the flat portion 14, as illustrated in FIG. 3A. Specifically, the field plate 10 extending from the side surface 13a of the step 13 of the insulating film 9 between the drain electrode 7 and the gate electrode. 8 to the drain electrode 7 is formed through the opening 21a of the first mask 21 and the window 22a of the second mask 22. For example, a metal material is vacuum evaporated on the insulating film 9 to form the field plate 10. Further, a metal 23 which does not form the field plate 10 is deposited on the second mask 22. The field plate 10 has, for example, a stacked structure including a Ni layer and an Au layer.

Figure 4A:
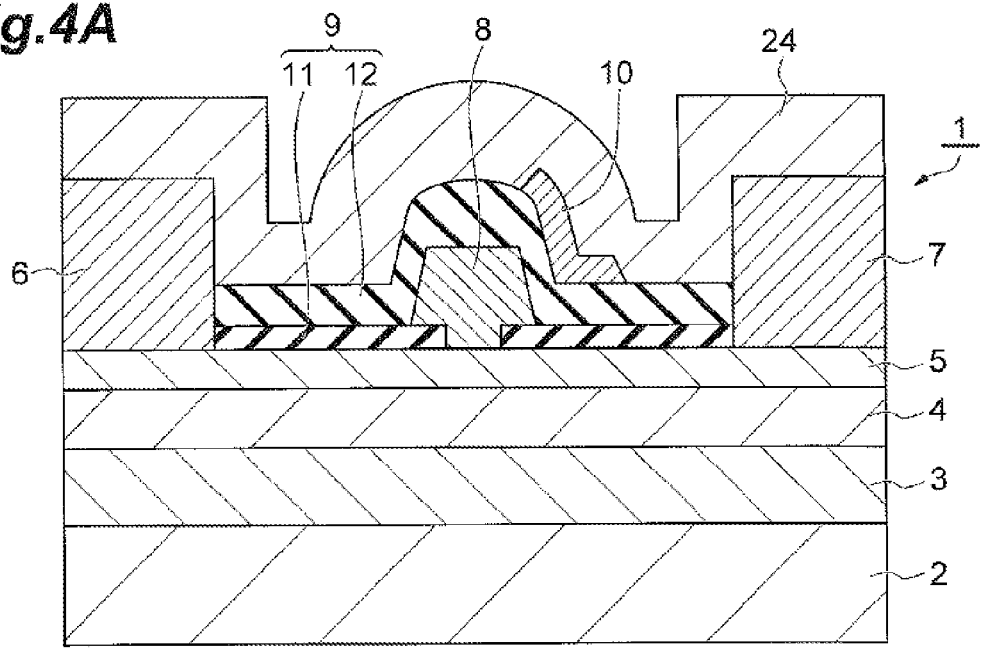
FIGS. 4A to 4B are diagrams illustrating a method of manufacturing a semiconductor device according to the first embodiment.
Figure 4B:
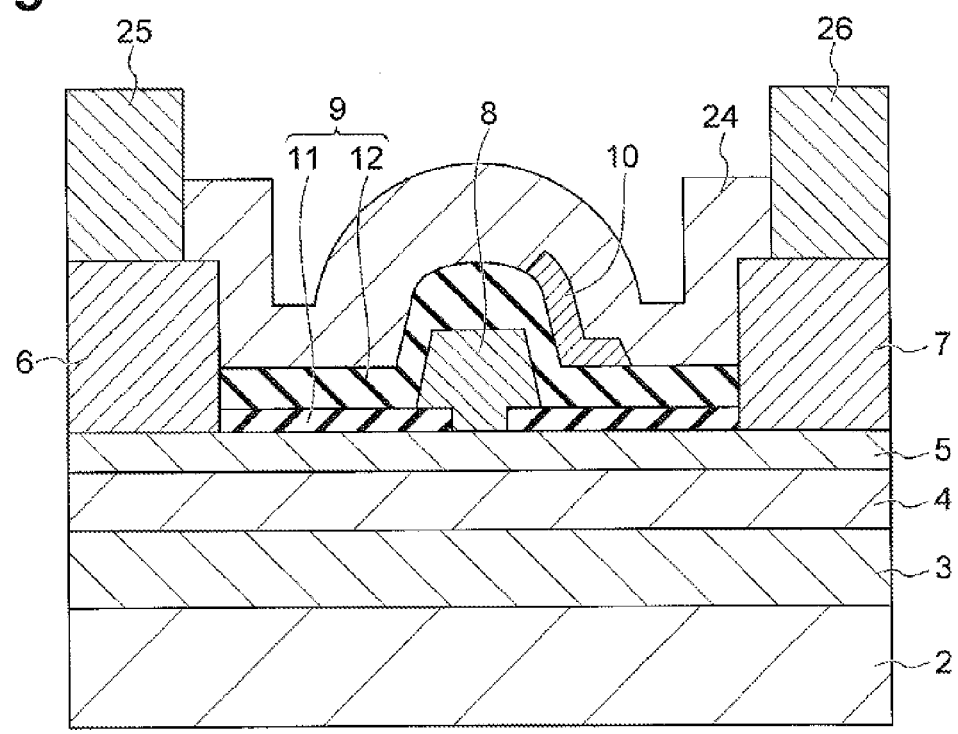

Then, the mask 20 is removed in a fifth step, as illustrated in Part FIG. 3B. The first mask 21 and the second mask 22 are removed, for example, by performing a lift-off of the first mask 21 from the transistor 1. In this case, the metal 23 deposited on the second mask 22 is removed together with the mask 20. Thus, the transistor 1 is formed, After the formation of the transistor 1, an insulating film 24 may be formed on the transistor 1 in a sixth step, as illustrated in FIG. 4A. Accordingly, a short-circuit and oxidation of the field plate 10 are suppressed. The insulating film 24 is a SiN film which is formed, for example, using the CVD method. Further, an interconnection 25 connected to the source electrode 6 and another interconnection 26 connected to the drain electrode 7 may be carried out in a seventh step, as illustrated in FIG. 4B. The interconnection 25 may be formed on the source electrode 6 exposed by removing a portion of the insulating film 24. Similarly, the interconnection 26 may be formed on the drain electrode 7 exposed by removing a portion of the insulating film 24. The interconnections 25 and 26 are, for example, an Au layer having a thickness of 3 to 5 μm. The interconnections 25 and 26 are formed, for example, using a vacuum deposition method and/or plating. The interconnection 25 may be formed so that the field plate 10 is connected to the source electrode 6.

Figure 6:
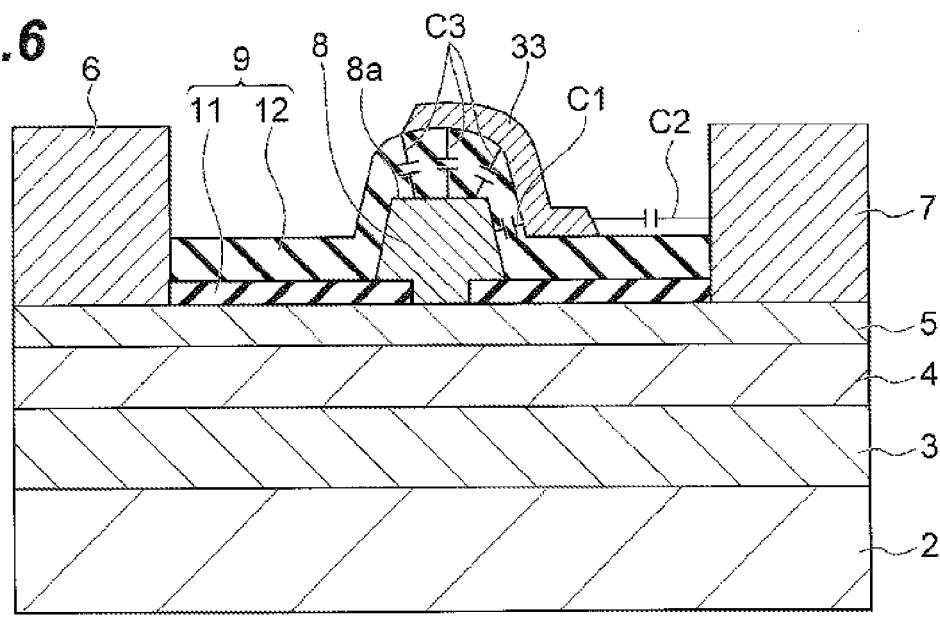
FIG. 6 is a diagram illustrating an example of the semiconductor device according to a comparative example.

Next, advantages of the method of manufacturing a semiconductor device according to the first embodiment will be described using FIGS. 5A to 7. FIGS. 5A and 5B are diagrams illustrating a method of manufacturing a semiconductor device according to a comparative example. FIG. 6 is a diagram illustrating an example of the semiconductor device according to the comparative example. FIG. 6 illustrates the same semiconductor device as that shown in FIG.

Figure 7:
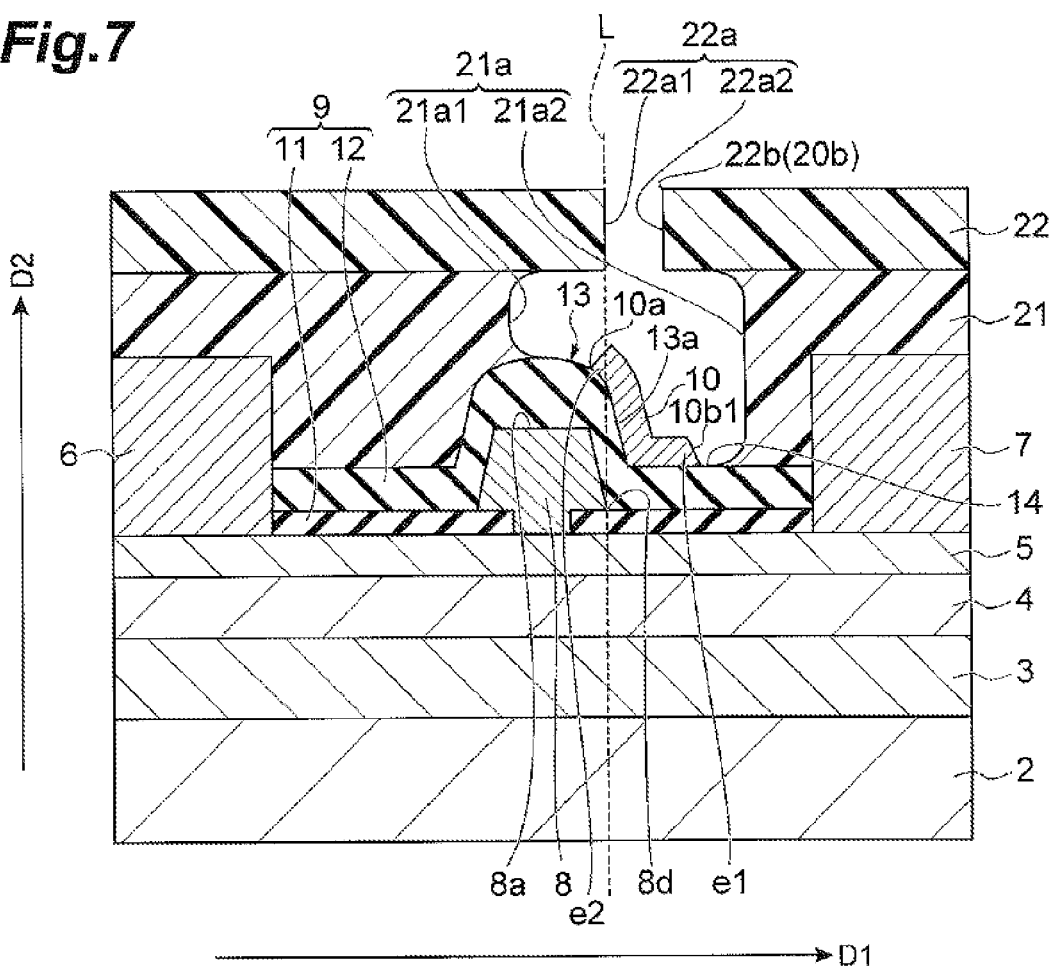
FIG. 7 is a cross-sectional view of a semiconductor device according to the first embodiment.

5A. FIG. 7 is a cross-sectional view of the semiconductor device according to the first embodiment.

In the method of manufacturing a semiconductor device according to the comparative example, an opening 31a is formed in the first mask 31 so that the step 13 of the insulating film 9 is exposed, as illustrated in FIGS. 5A and 5B. Further, a window 32a of the second mask 32 is formed so that the second mask 32 overlaps with the upper surface 13b of the step 13 of the insulating film 9, when viewed along a direction D2. Therefore, in the method of manufacturing a semiconductor device according to the comparative example, a field plate 33 is formed so as to cover at least a portion of the upper surface 8a of the gate electrode 8. In this case, a capacitor C3 is induced between the field plate 33 and the almost whole upper surface 8a of the gate electrode 8, for example, as illustrated in FIG. 6.

A shape of the field plate 33 illustrated in FIG. 5A is different from that of the field plate 34 shown in FIG. 5B. This is because the field plates 33 and 34 are formed using a vacuum deposition method, as illustrated above. In the vacuum evaporation, tracks of metals to be evaporated become almost linear from the position where the metals are evaporated. When a semiconductor device is formed on a wafer, linear tracks of the metals from an evaporated position to the semiconductor device are different depending on positions of semiconductor devices within the wafer. For example, when positions of the transistors 1b and 1c in the wafer are different, linear tracks M1 and M2 along which the metals come from are different from each other, as illustrated in FIGS. 5A and 5B. Therefore, a variation occurs in the shapes of the formed field plates 33 and 34, as illustrated in FIGS. 5A and 5B. Particularly, a variation of positions of one end 33a of the field plate 33 in the side of the source electrode 6 and one end 34a in the side of the source electrode 6 increases.

Meanwhile, in the method of manufacturing a semiconductor device according to the first embodiment, an edge 22a1 of the window 22a in the side of the source electrode 6 and an edge 8d of the gate electrode in the side of the drain electrode 7 along the direction D1 is formed, for example, as overlapping to each other on a dotted line L along direction D2, as illustrated in FIG. 7. An edge 22a2 of the window 22a in the side of the drain electrode 7 is located above the insulating film 9 between the drain electrode 7 and the side surface 13a of the step 13. Further, along the direction D1, the edge 21a1 of the opening 21a in the side of the source electrode 6 locate in the side of the source electrode 6 to the edge 22a1 of the second mask 22. Along the direction D1, the edge 21a2 of the first mask 21 in the side of the drain electrode 7 locates in the side of the drain electrode 7 relative to the edge 22a2 of the second mask 22. As a result, a distance along the direction D2 from the upper surface 20b of the second mask 22 to the flat portion 14 of the insulating film 9 becomes greater than a distance from the upper surface 20b of the mask 20 to the step 13 of the insulating film 9 (a height of the edge 21a1 in the side of the source electrode 6). Therefore, a thickness of the field plate 10 in the end portion e1 in the side of the drain electrode 7 decreases toward the drain electrode 7. Accordingly, because a relative distance between the end surface 10b1 and the drain electrode 7 becomes greater, it is possible to reduce the capacitance therebetween. Further, as a result, a thickness of the field plate 10 at the end portion e2 in the side of the source electrode 6 becomes greater than that of the end portion e1 in the side of the drain electrode 7.

Further, the distance along the direction D2 from the upper surface 20b of the mask 20 to the step 13 is smaller than that along the direction D2 from the upper surface 20b of the mask 20 to the flat portion 14 of the insulating film 9. In this region, the metals incident passing through the window 22a during the vacuum evaporation precisely reflects the shape of the window 22a. Therefore, along the direction D1, the field plate 10 may be exactly controlled in a vicinity of the step 13 not to overlap with the upper surface 8a of the gate electrode 8.

As described above, according to the method of manufacturing a semiconductor device of the first embodiment, the one end 10a of the field plate in the side of the source electrode 6 may be located in the side of the drain electrode 7 relative to the edge 8c of the upper surface 8a of the gate electrode 8 in the side of the gate electrode 7 along the direction D1 by forming the field plate 10 using the mask 20 described above. In the portion of a field plate overlapping with the upper surface of the gate electrode, advantages obtained by such a field plate, namely, to shield the coupling between the drain electrode and the gate electrode, are less important. Rather, such a field plate may cause an increase of parasitic capacitance between the field plate and the gate electrode. According to the present embodiment, since the field plate 10 may be formed not to cover the upper surface 8a of the gate electrode 8, it is possible to reduce the capacitance induced between the field plate 10 and the gate electrode 8. Further, it is possible to shield the coupling between the drain electrode 7 and the gate electrode 8.

Further, the thickness of the end portion e2 of the field plate 10 in the side of the source electrode 6 may be greater than the thickness of the other end portion e1 in the side of the drain electrode 7. In this case, along the direction D1, a thickness of the field plate 10 at the end portion e1 in the side of the drain electrode 7 reduces toward the drain electrode 7. Accordingly, it is possible to reduce capacitance induced between the end portion e1 of the field plate 10 in the side of the drain electrode 7 and the drain electrode 7.

Further, an angle θ1 formed by the end surface 10a1 of the one end 10a of the field plate 10 and the interface I1 between the field plate. 10 and the insulating film 9 may be an acute angle. In this case, capacitance induced between the end surface 10a1 of the one end 10a of the field plate 10 and the gate electrode 8 is reduced. Therefore, it is possible to further reduce the capacitance induced between the field plate 10 and the gate electrode 8.

Further, an angle θ2 formed by the end surface 10b1 of the other end 10b of the field plate 10 in the side of the drain electrode 7 and the interface I1 between the field plate 10 and the insulating film 9 may also be an acute angle. In this case, capacitance induced between the end surface 10b1 of the other end 10b of the field plate 10 and the drain electrode 7 is reduced.

Further, the one end 10a of the field plate 10 may be not in contact with the upper surface 13b of the step 13. In this case, it is possible to further reduce the capacitance caused between the field plate 10 and the gate electrode 8.

Further, the process of forming the mask 20 includes a process of forming the first mask 21 on the insulating film 9, a process of forming the second mask 22 having a lower photosensitivity than the first mask 21 on the first mask 21, and a process of irradiating the first mask 21 and the second mask 22 with ultraviolet light through a photomask having an opening to remove a portion of the first mask 21 and a portion of the second mask 22, and along the direction D2, the residual portion 21b in the first mask 21 may overlap with the gate electrode 8. In this case, the incidence of metals to form the field plate 10 on the gate electrode 8 is suppressed by the residual portion 21b of the first mask 21.

Therefore, the field plate 10 can be accurately formed so that the one end 10a of the field plate 10 is arranged in the side of the drain electrode 7 relative to the edge 8c of the upper surface 8a of the gate electrode 8. Further, the overhang may be accurately formed in the mask 20.

Figure 8:
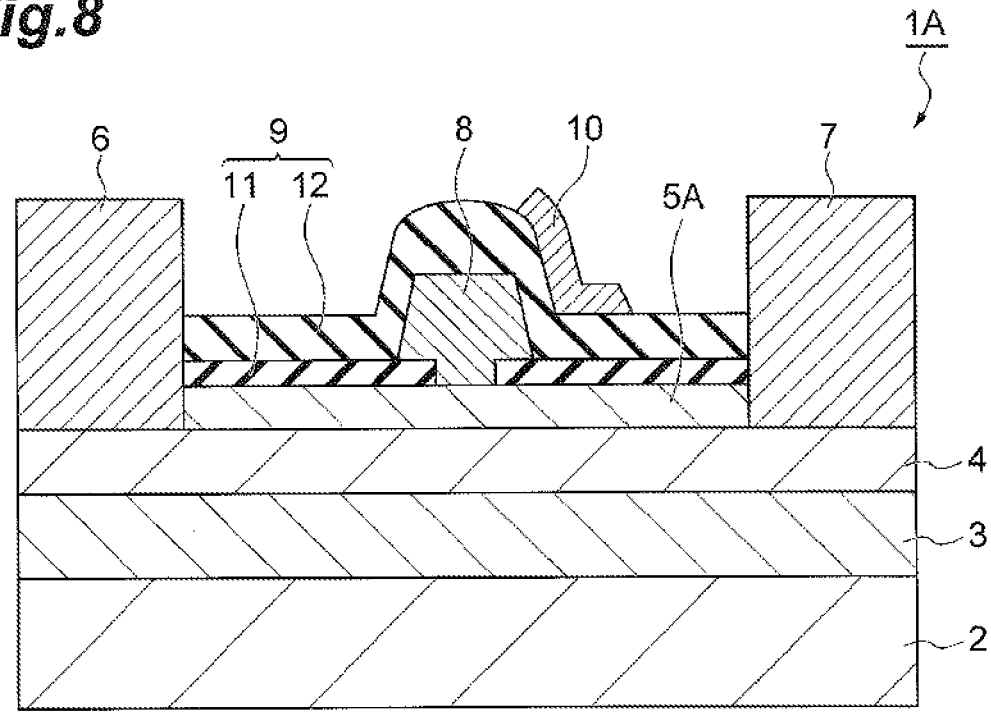
FIG. 8 illustrates a cross-sectional view of a semiconductor device according to a first modification example of the first embodiment.

FIG. 8 illustrates a cross-sectional view of a semiconductor device according to the first modification of the first embodiment. In a transistor 1A, each of a source electrode 6 and a drain electrode 7 is provided to make an ohmic contact to an electron supply layer 4, as illustrated in FIG. 8. In this case, a portion of a cap layer 5A is removed before each of the source electrode 6 and the drain electrode 7 is formed. The portion of the cap layer 5A is removed, for example, using a resist mask. In this case, the advantages same as those of the semiconductor device according to the first embodiment are also achieved. Further, the contact resistance in each of the source electrode 6 and the drain electrode 7 is reduced. Therefore, a semiconductor device having much better electrical characteristics is provided.

Figure 9:
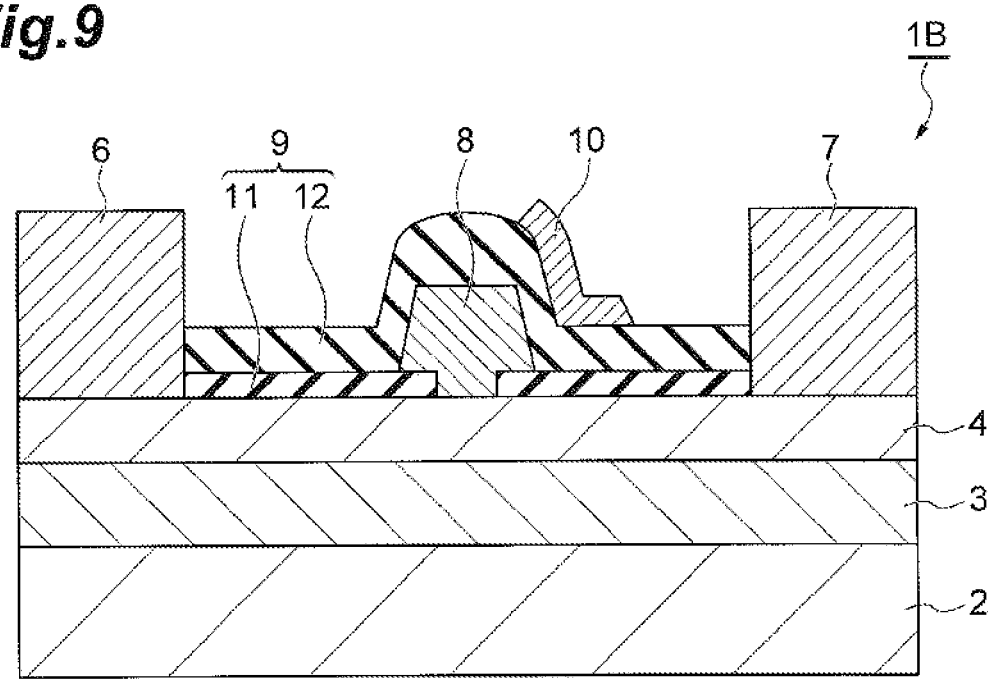
FIG. 9 illustrates a cross-sectional view of a semiconductor device according to a second modification example of the first embodiment.

FIG. 9 illustrates a cross-sectional view of a semiconductor device according to the second modification of the first embodiment. In a transistor 1B, a cap layer 5 is not provided on the electron supply layer 4, as illustrated in FIG. 9, Therefore, each of the source electrode 6 and the drain electrode 7 makes an ohimc contact to the electron supply layer 4. Further, the gate electrode 8 is provided to directly contact the electron supply layer 4. In this case, the advantages same as those in the first embodiment are also achieved. Further, a semiconductor device in which the contact resistance between the source electrode 6 and the electron supply layer 4 and that between the drain electrode 7 and the electron supply layer 4 are reduced, and high frequency characteristics are improved is provided.

Figure 10:
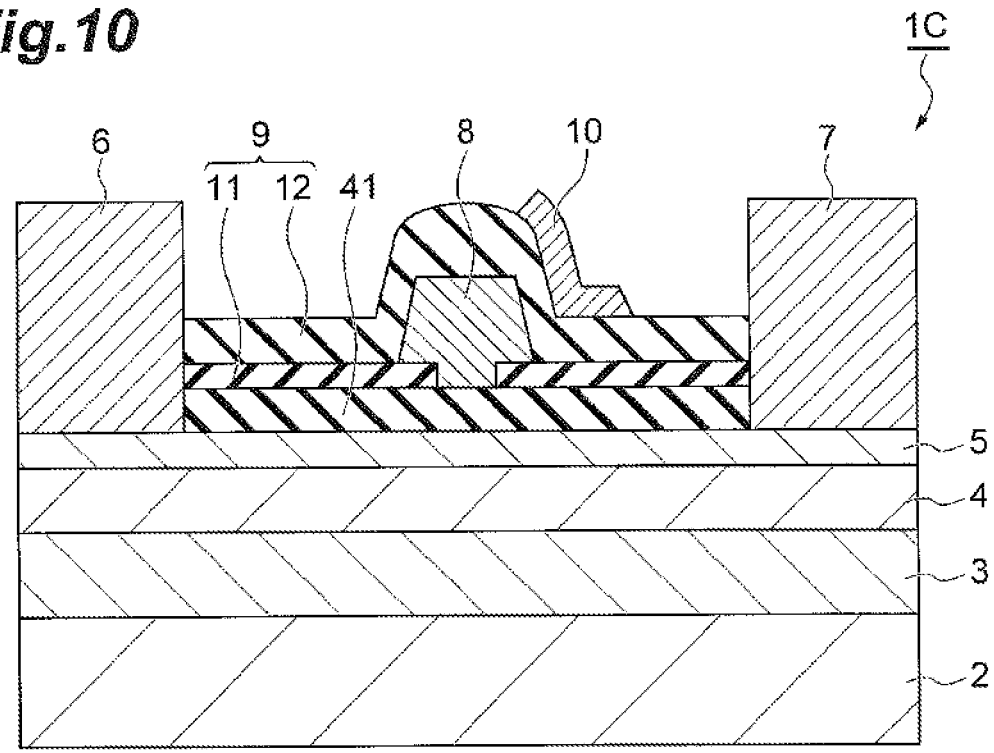
FIG. 10 illustrates a cross-sectional view of a semiconductor device according to a third modification example of the first embodiment.

FIG. 10 illustrates a cross-sectional view of a semiconductor device according to the third modification of the first embodiment. In a transistor 1C, an insulating film 41 is provided on a portion of a cap layer 5, as illustrated in FIG. 10. Therefore, a gate electrode 8 is provided on an insulating film 41. The insulating film 41 is made of, for example, a silicon nitride (SiN), a silicon oxide (SiOx), a silicon nitride oxide (SiON), an aluminum oxide (AlOx), an aluminum nitride (AlN), a hafnium oxide (HfO$_2$), a magnesium oxide (MgO), and so on. In this case, the advantages same as those in the first embodiment are also achieved. Further, a short-circuit of the gate electrode 8 by the other films is prevented by the insulating film 41, and thus, a highly reliable semiconductor device is provided.

Figure 11:
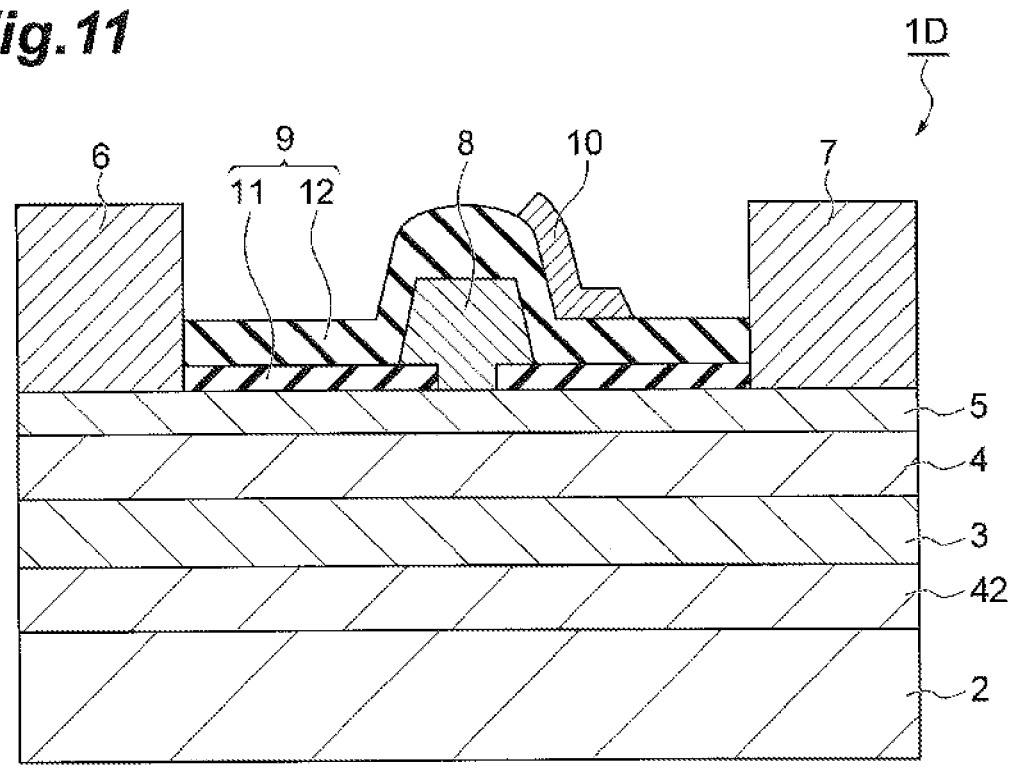
FIG. 11 illustrates a cross-sectional view of a semiconductor device according to a fourth modification example of the first embodiment.

FIG. 11 illustrates a cross-sectional view of a semiconductor device according to the fourth modification of the first embodiment. In a transistor 1D, a buffer layer 42 is provided between a substrate 2 and a nitride semiconductor layer 3, as illustrated in FIG. 11. The buffer layer 42 is, for example, an AlGaN layer. In this case, the advantages same as those in the first embodiment are also achieved. Further, by the buffer layer 42 being provided, a short channel effect of the transistor 1D is suppressed. Therefore, the semiconductor device in which a gate length of the transistor 1D can be shortened and high frequency characteristics are improved is provided.

Figure 12:
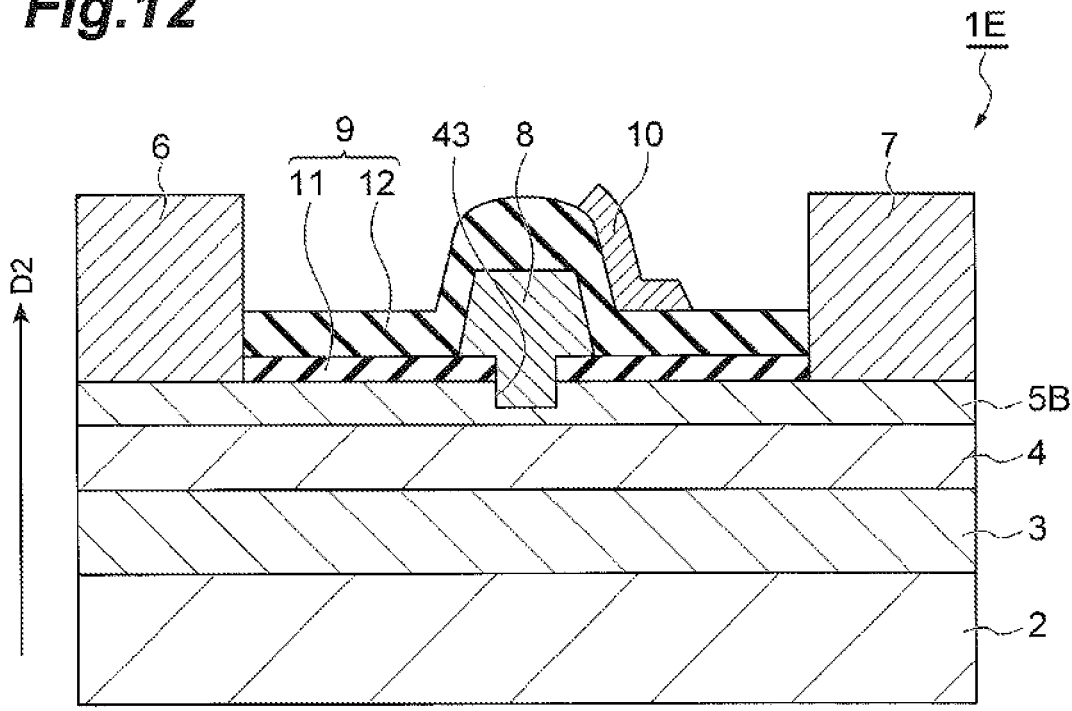
FIG. 12 illustrates a cross-sectional view of a semiconductor device according to a fifth modification example of the first embodiment.

FIG. 12 illustrates a cross-sectional view of a semiconductor device according to the fifth modification of the first embodiment. In a transistor 1E, a recess 43 is formed in a portion of a cap layer 5B in contact with a gate electrode 8 when viewed along the direction D2, as illustrated in FIG. 12. The recess 43 is filled with the gate electrode 8. In this case, the advantages same as those in the first embodiment are also achieved. Further, by the recess 43 being provided, a semiconductor device in which an electric field in a gate edge is alleviated and high frequency characteristics are improved is provided. Further, the recess 43 may be an opening penetrating the cap layer 5B along the direction D2. In this case, the gate electrode 8 contacts an electron supply layer 4.

Figure 13:
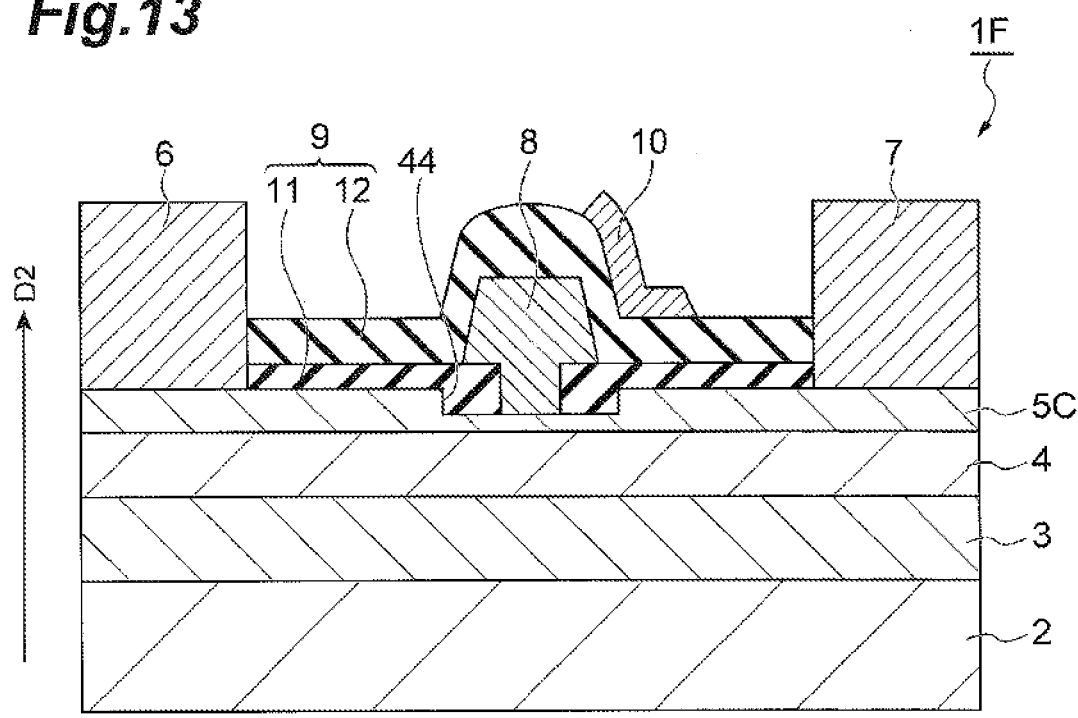
FIG. 13 illustrates a cross-sectional view of a semiconductor device according to a sixth modification example of the first embodiment.

FIG. 13 illustrates a cross-sectional view of a semiconductor device according to the sixth modification of the first embodiment. In a transistor 1F, a recess 44 is formed in a region of a cap layer 5C overlapping with a gate electrode 8 when viewed along the direction D2 and the vicinity thereof, as illustrated in FIG. 13. The recess 44 is filled with the gate electrode 8 and a first insulating film 11. In this case, the advantages same as those in the first embodiment are also achieved. Further, by the recess 44 being provided, a semiconductor device in which an electric field in a gate end is alleviated, high frequency characteristics are improved, and a breakdown voltage is improved is provided. Further, the recess 44 may be an opening penetrating the cap layer 5C along the direction D2. In this case, the gate electrode 8 contacts an electron supply layer 4.

Figure 14:
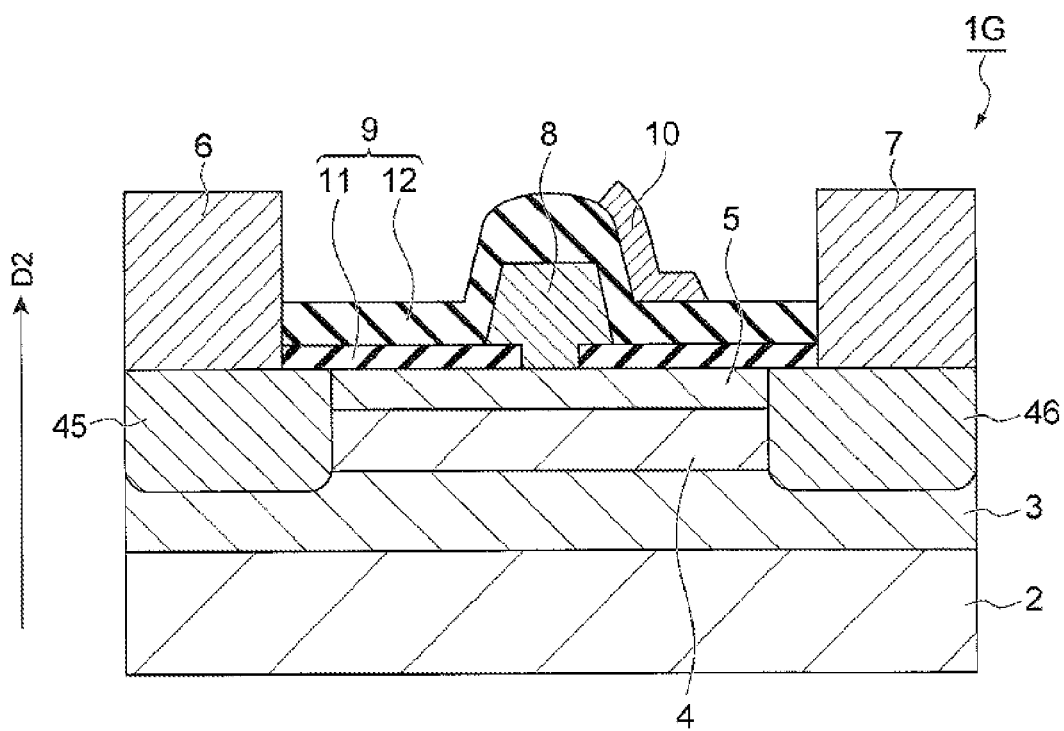
FIG. 14 illustrates a cross-sectional view of a semiconductor device according to a seventh modification example of the first embodiment.

FIG. 14 illustrates a cross-sectional view of a semiconductor device according to the seventh modification of the first embodiment. In a transistor 1G an n+ region 45 is formed in a region overlapping with a source electrode 6 in a nitride semiconductor layer 3, an electron supply layer 4, and a cap layer 5, when viewed along the direction D2, and in the vicinity thereof, as illustrated in FIG. 14. Similarly, an n+ region 46 is formed in a region overlapping a drain electrode 7 in the nitride semiconductor layer 3, the electron supply layer 4, and the cap layer 5, when viewed along the direction D2, and in the vicinity thereof. The n+ regions 45 and 46 are, for example, regions in which a dopant such as silicon (Si) or germanium (Ge) are contained at higher concentrations than that of other regions in the nitride semiconductor layer 3, the electron supply layer 4, and the cap layer 5. In this case, the advantages same as those in the first embodiment are also achieved. Further, contact resistance in each of the source electrode 6 and the drain electrode 7 is reduced by the n+ regions 45 and 46 being provided. Further, the n+ regions 45 and 46 may be provided only in the cap layer 5 or may be provided only in the electron supply layer 4 and the cap layer 5.

(Second Embodiment)

FIG. 15 illustrates a cross-sectional view of a semiconductor device according to the second embodiment. In a transistor 101D, one end 110d of the field plate 110B in the side of the source electrode 6 locates on the side of the drain electrode 7 relative to the edge 8c of the upper surface 8a of a gate electrode 8, as illustrated in FIG. 15. This field plate 110B is formed using the method same as that of the first embodiment. In this case, the advantages same as those of the second embodiment are also obtained. Further, since the advantages same as those in the first embodiment are achieved, a semiconductor device in which the capacitor between the field plate 110B and the gate electrode 8 is further reduced is provided. Further, the one end 110d of the field plate 110B may not overlap with the step 113. In this case, it is possible to further reduce the capacitance caused between the field plate 110B and the gate electrode 8.

FIG. 16 illustrates a cross-sectional view of a semiconductor device according to a modified example of the second embodiment. The transistor 101E includes an insulating film 109A and the field plate 110B. In this case, the advantages same as those of the second embodiment are also obtained. Further, a semiconductor device achieving making the advantages of the example shown in FIG. 15 is provided.

Figure 17:
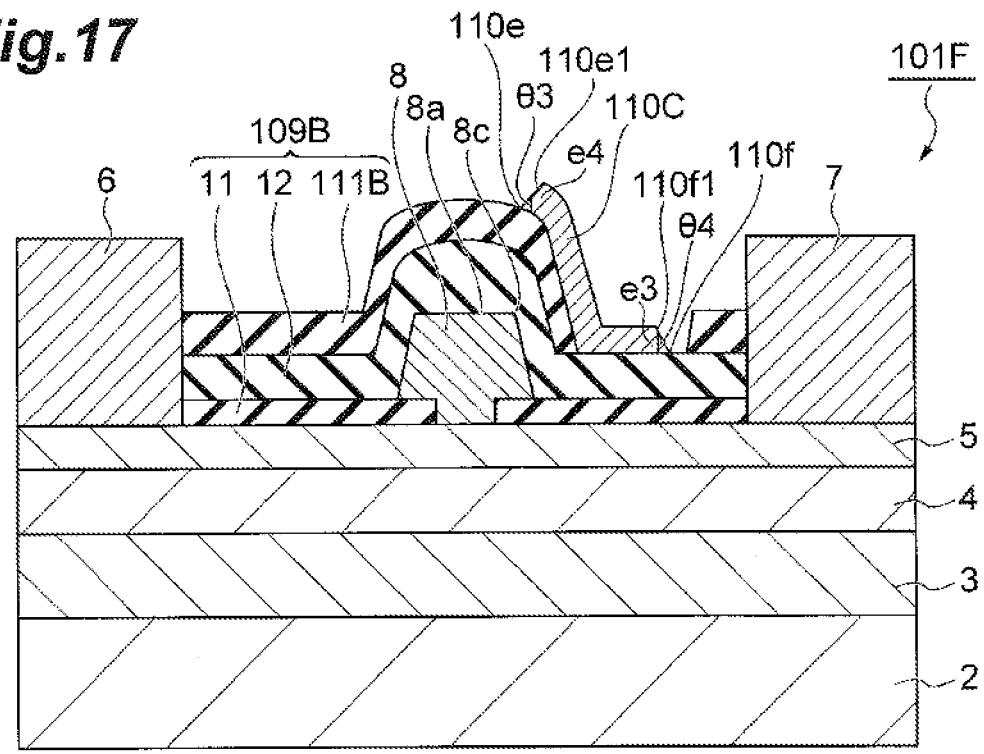
FIG. 17 illustrates a cross-sectional view of a semiconductor device according to a sixteenth modification example of the second embodiment.

FIG. 17 illustrates a cross-sectional view of a semiconductor device according to another modified example of the second embodiment. In the transistor 101F, one end 110e of the field plate 110c in the side of the source electrode 6 locates in the side of the drain electrode 7 relative to the edge 8c of the upper surface 8a of a gate electrode 8. An angle θ3 formed by the end surface 110e1 of the field plate 110C and the top surface of the third insulating film 111B becomes an acute angle. Further, the other end 110f of the field plate 110c in the side of the drain electrode 7 terminates on the second insulating film 12. An angle θ4 formed by the end surface 110f1 of the field plate 110C and the top surface of the second insulating film 12 becomes an acute angle. In this case, the advantages same as those of the second embodiment are also obtained. Further, a semiconductor device showing the advantages of the transistor shown in FIG. 15 is obtained. Further, the field plate 10 has a thickness at the end portion e4 of the side of the source electrode 6 greater than the thickness at the end portion e3 in the side of the drain electrode 7.

Figure 18:
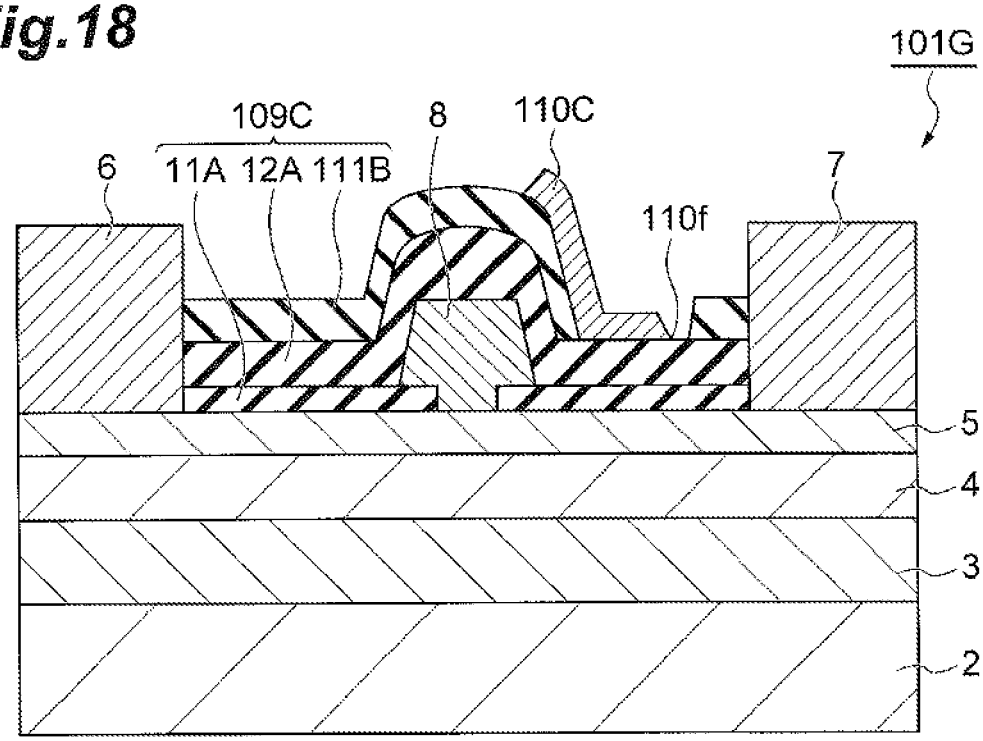
FIG. 18 illustrates a cross-sectional view of a semiconductor device according to a seventeenth modification example of the second embodiment.

FIG. 18 illustrates a cross-sectional view of a semiconductor device according to a still another modified example of the second embodiment. The field plate 110C in the other end 110f terminates on the second insulating film 12A. In this case, the advantages same as those of the second embodiment are also obtained. Further, a semiconductor device showing the advantages of the transistor shown in FIG. 17 is obtained.

The method of manufacturing the semiconductor device and the semiconductor device manufactured thereby according to the present invention are not limited to the above-described embodiment, but various variations are possible. For example, the above-described embodiment and the examples modified therefrom may be appropriately combined. For example, the stacking structure of the semiconductor layer of the first embodiment may be applied to the second embodiment.

What is claimed is:

1. A method of manufacturing a semiconductor device, the method comprising:
    forming a gate electrode, a source electrode, and a drain electrode on a semiconductor layer, the gate electrode having an edge in a side of the drain electrode and another edge in a side of the source electrode;
    forming an insulating film that includes a step and a flat portion on a surface thereof, the step covering the gate electrode and tracing a shape of the gate electrode, the flat portion locating between the step and the drain electrode;
    forming a mask on the insulating film, the mask having an window and an opening to form an overhang, the window communicating with an outside, the opening communicating with the window and positioned between the window and the insulating film, the window having a first side in the side of the source electrode and a second side in the side of the drain electrode, the first side being aligned with the edge of the gate electrode in the side of the drain electrode, the second side being positioned on the flat portion of the insulating film; and
    depositing a metal on the insulating film using the mask to form a field plate extending from a side surface of the step to the flat portion.

2. The method of manufacturing a semiconductor device according to claim 1, wherein one end of the opening is located above an upper surface of the gate electrode and another end of the opening is located on the flat portion.

3. The method of manufacturing a semiconductor device according to claim 1,
    wherein the field plate has a thickness in an end portion thereof in a side of the source electrode greater than a thickness of another end portion thereof in a side of the drain electrode.

4. The method of manufacturing a semiconductor device according to claim 1, wherein
    the step of forming the mask includes steps of:
    forming a first photoresist on the insulating film;
    forming a second photoresist on the first photoresist sequentially, the second photoresist having a lower photosensitivity than the first photoresist; and
    irradiating the first photoresist and the second photoresist with ultraviolet light.

5. The method of claim 1, wherein the step of forming the insulating film includes steps of: forming a first insulating film on the semiconductor layer;
    covering the gate electrode with a second insulating film on the first insulating film such that the second insulating film has a step with a shape tracing a shape of the gate electrode and a flat portion locating between the gate electrode and the drain electrode;
    forming a third insulating film on the second insulating film, the third insulating film having a step with a shape tracing the step of the second insulating film and a flat portion between the step of the third insulating film and the drain electrode; and
    etching the flat portion of the third insulating film to form an opening.

6. The method of claim 5, wherein the third insulating film is made of material showing a larger etching rate compared with an etching rate of the second insulating film.

7. The method of claim 6, wherein, in the step of forming the mask, the second side of the window terminates in the opening.

8. The method of claim 7, wherein, in the step of forming the mask, the second side of the window terminates on the third insulating film.

9. The method of claim 5, wherein the second insulating film is made of silicon nitride (SiN) and the third insulating film is made of silicon oxide (SiOx).

* * * * *